United States Patent
Georgantas (10) Patent No.: US 12,301,234 B2
(45) Date of Patent: May 13, 2025

(54) SUPERCONDUCTING PASSIVE TRANSMISSION LINE (PTL) RECEIVER SYSTEM

(71) Applicant: NORTHROP GRUMMAN SYSTEMS CORPORATION, Falls Church, VA (US)

(72) Inventor: Domenic Nickolas Georgantas, Baltimore, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 129 days.

(21) Appl. No.: 18/347,884

(22) Filed: Jul. 6, 2023

(65) Prior Publication Data
US 2025/0015804 A1  Jan. 9, 2025

(51) Int. Cl.
*H03K 19/195* (2006.01)
*G06N 10/40* (2022.01)
*H04B 1/18* (2006.01)

(52) U.S. Cl.
CPC ......... *H03K 19/1952* (2013.01); *G06N 10/40* (2022.01); *H04B 1/18* (2013.01)

(58) Field of Classification Search
CPC ....... H03K 19/1952; G06N 10/40; H04B 1/18
USPC .............................. 505/210; 326/3
See application file for complete search history.

(56) References Cited

U.S. PATENT DOCUMENTS

| | | | |
|---|---|---|---|
| 9,876,505 B1 * | 1/2018 | Dai ...................... | H03K 19/195 |
| 11,486,910 B1 * | 11/2022 | Ballard ................. | G01R 15/18 |
| 2016/0015635 A1 | 6/2016 | Miller et al. | |
| 2023/0014541 A1 | 5/2023 | Stephen | |

FOREIGN PATENT DOCUMENTS

| | | | |
|---|---|---|---|
| JP | 2001251178 A | 9/2001 | |
| JP | 2008306538 A | 12/2008 | |

OTHER PUBLICATIONS

US 2021/0003500 A2, 02/2021, Herr et al. (withdrawn)
WOISR (Written Opinion & International Search Report) mailed Sep. 24, 2024 for corresponding PCT/US2024/032436.

* cited by examiner

*Primary Examiner* — Arnold M Kinkead
(74) *Attorney, Agent, or Firm* — Tarolli, Sundheim, Covell & Tummino LLP (57) ABSTRACT

One example includes a PTL receiver system. The system includes a receiver core that comprises an input Josephson junction and that receives an input pulse from a PTL. The system also includes an active bias circuit which generates a bias pulse based on a bias clock signal and provides the bias pulse to the receiver core. The bias pulse can have a pulse-width approximately one-half a period of the bias clock signal. The input Josephson junction can trigger to generate an intermediate pulse in response to the input and bias pulses. The system further includes an alignment JTL comprising at least one alignment Josephson junction. The alignment Josephson junction can be configured to trigger to generate an output pulse in response to the intermediate pulse and the bias clock signal to provide for reception of the input pulse across a wide timing window based on the bias pulse.

20 Claims, 3 Drawing Sheets

SUPERCONDUCTING PASSIVE TRANSMISSION LINE (PTL) RECEIVER SYSTEM

GOVERNMENT INTEREST

The invention was made under Government Contract. Therefore, the US Government has rights to the invention as specified in that contract.

TECHNICAL FIELD

The present invention relates generally to computer systems, and specifically to a superconducting PTL receiver system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux superconducting circuitry, utilizing superconducting Josephson junctions, and can exhibit typical signal power dissipation of less than 1 nW (nanowatt) per active device at a typical data rate of 20 Gb/s (gigabytes/second) or greater, and can operate at temperatures of around 4 Kelvin.

Multiple Josephson junctions and inductors can be provided in a specific arrangement to provide a Josephson transmission line (JTL) to propagate data signals in superconductor computing systems, such as in a Reciprocal Quantum Logic (RQL) encoding scheme. As an example, the sequential triggering can be based on a bias current provided to a given one of the Josephson junctions, such that the Josephson junction is triggered in response to receiving the fluxon. As a result, the bias current can provided at a time that is approximately concurrent with or slightly after the arrival of the fluxon to provide appropriate timing for the triggering of the Josephson junction. By contrast, a passive transmission line (PTL) is not biased by a clock signal, and an associated PTL receiver cannot receive a fluxon prior to a bias current based on the presence of an input resistor. Therefore, it may therefore be difficult to align a fluxon arriving from a PTL to a specific phase of the clock signal at an associated PTL receiver.

SUMMARY

One example includes a superconducting PTL receiver system. The system includes a receiver core that comprises an input Josephson junction and that receives an input pulse from a PTL. The system also includes an active bias circuit which generates a bias pulse based on a bias clock signal and provides the bias pulse to the receiver core. The bias pulse can have a pulse-width approximately one-half a period of the bias clock signal. The input Josephson junction can trigger to generate an intermediate pulse in response to the input and bias pulses. The system further includes an alignment JTL comprising at least one alignment Josephson junction. The alignment Josephson junction can be configured to trigger to generate an output pulse in response to the intermediate pulse and the bias clock signal to provide for reception of the input pulse across a wide timing window based on the bias pulse.

Another example includes a method for aligning a reciprocal quantum logic (RQL) input pulse from a passive transmission line (PTL) to a phase of a bias clock signal. The method includes providing a DC bias current to a primary of a transformer of an active bias circuit to provide an induced bias current on a secondary of the transformer based on the DC bias current. The induced bias current providing a bias for a pulse-generator Josephson junction. The method also includes providing the bias clock signal to the active bias circuit to trigger the pulse-generator Josephson junction in response to an approximate positive zero-crossing of a first phase of the bias clock signal to generate a bias pulse having a bias amplitude pulse-width that is approximately one-half a period of the bias clock signal. The method also includes providing the RQL input pulse to a receiver core, the receiver core comprising at least one input Josephson junction configured to trigger in response to the RQL input pulse and the to generate an intermediate pulse in response to the input pulse and the bias pulse. The method further includes providing the bias clock signal to an alignment Josephson transmission line (JTL) to trigger at least one alignment Josephson junction to generate an output pulse in response to the intermediate pulse and a second phase of the bias clock signal subsequent to the first phase to provide for reception of the input pulse across a wide timing window based on the bias pulse.

Another example includes a superconducting reciprocal quantum logic (RQL) passive transmission line (PTL) receiver system. The system includes a receiver core comprising an input resistor and at least one input Josephson junction and configured to receive a reciprocal quantum logic (RQL) input pulse from a PTL through the input resistor. The system also includes an active bias circuit. The active bias circuit includes a pulse generator configured to generate a bias pulse based on a first phase of a bias clock signal. The bias pulse can have a bias amplitude pulse-width that is approximately one-half a period of the bias clock signal. The active bias circuit also includes a biasing buffer configured to amplify the bias pulse and to propagate the bias pulse to the receiver core. The at least one input Josephson junction of the receiver core can be configured to trigger to generate an intermediate pulse in response to the input pulse and the bias pulse. The system further includes an alignment Josephson transmission line (JTL) comprising at least one alignment Josephson junction. The at least one alignment Josephson junction of the alignment JTL can be configured to trigger to generate an output pulse in response to the intermediate pulse and a second phase of the bias clock signal that is subsequent to the first phase to provide for reception of the input pulse across a wide timing window based on the bias pulse.

DETAILED DESCRIPTION

The present invention relates generally to computer systems, and specifically to a superconducting passive transmission line (PTL) receiver system. The superconducting PTL receiver system can be implemented in any of a variety of superconducting computer systems, such as implementing reciprocal quantum logic (RQL), in which single flux quantum (SFQ) pulses (e.g., RQL pulses) are propagated on a PTL. The superconducting PTL receiver system can thus be configured to receive an input pulse (e.g., an SFQ pulse) from the PTL and align the input pulse to a bias clock signal on an associated Josephson transmission line (JTL). In this manner, the superconducting PTL receiver system can provide pulse-waiting for a PTL receiver to facilitate phase alignment of the input pulse from the PTL to the JTL via the superconducting PTL receiver system.

The superconducting PTL receiver system includes a receiver core that includes an input resistor and at least one input Josephson junction. The receiver core thus receives the input pulse from the PTL which propagates through the input resistor to the input Josephson junction. The superconducting PTL receiver system also includes an active bias circuit that is configured to generate a bias pulse based on a bias clock signal. As an example, the active bias circuit includes a pulse generator and a biasing buffer. The pulse generator can include a transformer that is configured to induce a DC bias current to a pulse generator Josephson junction to provide bias of the pulse generator Josephson junction. Thus, in response to the bias on the pulse generator Josephson junction from the induced DC bias current, the pulse generator Josephson junction can trigger in response to a positive zero-crossing of the bias clock signal to generate the bias pulse as having a pulse-width that is approximately half the period of the bias clock signal. The biasing buffer can be configured to amplify and propagate the bias pulse to the receiver core.

In response to the bias pulse being provided to the receiver core, the input pulse and the bias pulse can be sufficient to trigger the input Josephson junction to generate an intermediate pulse. The intermediate pulse is provided to an alignment JTL that includes at least one alignment Josephson junction. The alignment Josephson junction is configured to trigger in response to the intermediate pulse and the bias clock signal to generate an output pulse that is provided from the alignment JTL. For example, the bias clock signal can be provided at a first phase to the pulse generator and at a second phase to the alignment JTL, with the second phase being subsequent to the first phase. Based on the phase-delay of the second phase of the bias clock signal relative to the first phase, the superconducting PTL receiver system can implement pulse waiting to provide for a large data open propagation window of the input pulse to align the output pulse to the bias clock signal. In other words, based on the wide duty-cycle of the bias pulse and the delay of the second phase of the bias clock signal at the alignment JTL relative to the first phase of the bias clock signal at the active bias circuit, the superconducting PTL receiver system provides for a wide receiver window that allows input pulses from the PTL to have a wide timing spread of reception by the superconducting PTL receiver system.

Figure 1:
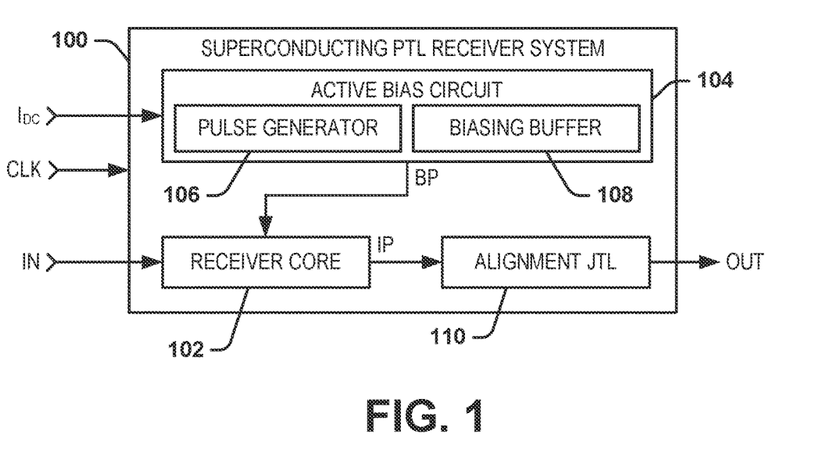
FIG. 1 illustrates an example block diagram of a superconducting PTL receiver system.

FIG. 1 illustrates an example block diagram of a superconducting PTL receiver system 100. The superconducting PTL receiver system 100 can be implemented in any of a variety of superconducting computer systems, such as implementing reciprocal quantum logic (RQL), in which single flux quantum (SFQ) pulses (e.g., RQL pulses) are propagated on a PTL.

In the example of FIG. 1, the superconducting PTL receiver system 100 receives an input pulse IN (e.g., an SFQ or RQL pulse) from an associated PTL. The input pulse IN is provided to a receiver core 102 that includes an input resistor and at least one input Josephson junction. The receiver core 102 thus receives the input pulse from the PTL which propagates through the input resistor to the input Josephson junction.

The superconducting PTL receiver system 100 also includes an active bias circuit 104 that is configured to generate a bias pulse BP based on a bias clock signal CLK. In the example of FIG. 1, the active bias circuit 104 includes a pulse generator 106 and a biasing buffer 108. The pulse generator 106 can include a transformer that is configured to generate an induced bias current to a pulse generator Josephson junction in response to a DC current $I_{DC}$ to provide bias of the pulse generator Josephson junction. Thus, in response to the bias on the pulse generator Josephson junction from the induced bias current, the pulse generator Josephson junction can trigger at approximately a positive zero-crossing of the bias clock signal CLK to generate the bias pulse BP as having a pulse-width that is approximately half the period of the bias clock signal CLK. The biasing buffer 108 can be configured to amplify and propagate the bias pulse BP to the receiver core 102, such as based on different subsequent phases of the bias clock signal CLK.

In response to the bias pulse BP being provided to the receiver core 102, the input pulse IN and the bias pulse BP can be sufficient to trigger the input Josephson junction to generate an intermediate pulse IP. In the example of FIG. 1, the superconducting PTL receiver system 100 also includes an alignment JTL 110 that includes at least one alignment Josephson junction and which is biased by a given phase of the bias clock signal CLK (e.g., subsequent to the phase that generates the bias pulse BP). The intermediate pulse IP is provided to the alignment JTL 110, such that the alignment Josephson junction is configured to trigger in response to the intermediate pulse IP and the bias clock signal CLK to generate an output pulse OUT that is provided from the alignment JTL 110. The output pulse OUT can thus propagate to other parts of an associated superconducting circuit in a manner that is time-aligned with specific phases of the bias clock signal CLK.

As described above and in greater detail herein, the superconducting PTL receiver system 100 can provide for alignment of the input pulse to specific phases of the bias clock signal CLK. As an example, the input pulse IN can be provided on the associated PTL in a manner that is agnostic with respect to specific phases of the bias clock signal CLK. For a conventional PTL receiver, the timing at which pulses propagate across the PTL to the PTL receiver can be very specifically timed (e.g., during testing) to ensure proper timing of the receipt of the input pulse given that the input resistor of the PTL receiver prohibits pulse waiting associated with energy to the input pulse being stored in input inductors. However, in the example of FIG. 1, because the bias pulse BP is generated with such a large duty-cycle, and based on the phase-delay of the phase of the bias clock signal CLK provided to the alignment JTL 110 relative to the phase of the bias clock signal provided to the pulse generator 106, the superconducting PTL receiver system 100 can implement pulse waiting. Accordingly, the superconducting PTL receiver system 100 can provide for a large data open propagation window of the input pulse IN to the superconducting PTL receiver system 100. The superconducting PTL receiver system 100 can thus capture the input pulse IN and align the corresponding output pulse OUT to the bias clock signal CLK.

In addition, the active bias circuit 104 can regulate the peak amplitude of the bias pulse BP. For example, because the input pulse IN can be provided from the PTL as having a very small amplitude, the receiver core 102 can be configured to have a very small operating range with respect to the biasing of the associated input Josephson junction(s). Based on the small operating range with respect to the biasing of the associated input Josephson junction(s), the receiver core 102 can be sensitive to the small amplitude of the input pulse IN, thereby enabling the triggering of the associated input Josephson junction(s) to provide the intermediate pulse IP. As a result, the active bias circuit 104 can be configured to provide the bias pulse BP as having a smaller peak amplitude than the bias clock signal CLK. Therefore, the active bias circuit 104 can regulate the peak amplitude of the bias pulse BP to be less than the peak amplitude of the bias clock signal CLK to accommodate the smaller operating range that may be required to generate the intermediate pulse IP in response to the small amplitude of the input pulse IN.

Figure 2:
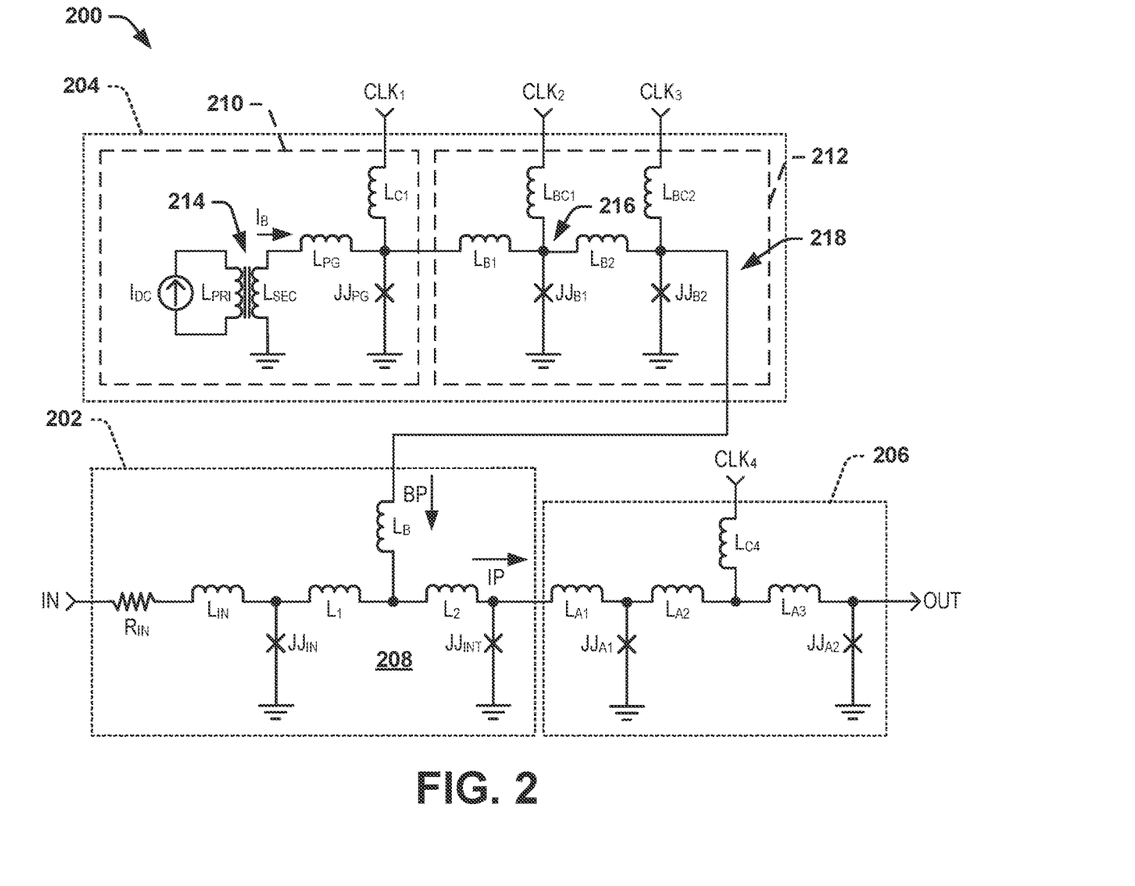
FIG. 2 illustrates an example diagram of a superconducting PTL receiver system.

FIG. 2 illustrates an example diagram of a superconducting PTL receiver system 200. The superconducting PTL receiver system 200 can correspond to the superconducting PTL receiver system 100 in the example of FIG. 1, and can thus be implemented in any of a variety of superconducting computer systems.

In the example of FIG. 2, the superconducting PTL receiver system 200 includes a receiver core 202, an active bias circuit 204, and an alignment JTL 206. The receiver core 202 includes an input resistor $R_{IN}$, an input inductor $L_{IN}$, an input Josephson junction and an intermediate Josephson junction, demonstrated respectively as $JJ_{IN}$ and $JJ_{INT}$, and a set of inductors $L_1$ and $L_2$. The inductors $L_1$ and $L_2$ and the Josephson junctions $JJ_{IN}$ and $JJ_{INT}$ form a superconducting quantum interference device (SQUID) 208 that is provided a bias pulse BP as a bias via a bias inductor $L_B$. The receiver core 202 is configured to receive an input pulse IN (e.g., an SFQ or RQL pulse) from an associated PTL (not shown). The input pulse IN is thus provided to the SQUID 208 through the input resistor $R_{IN}$ and the input inductor $L_{IN}$ to the input Josephson junction.

The active bias circuit 204 is configured to generate the bias pulse BP and provide the bias pulse BP to the receiver core 202 via the bias inductor $L_B$. In the example of FIG. 2, the active bias circuit 204 includes a pulse generator 210 and a biasing buffer 212. The pulse generator 210 includes a transformer 214 that is configured to generate an induced bias current $I_B$ at a secondary $L_{SEC}$ in response to a DC current $I_{DC}$ that is provided through a primary $L_{PRI}$. As described herein, the terms "primary" and "secondary" with respect to the transformer 214 can refer to an inductive coupling either between parallel wires or between coiled inductors. The induced bias current $I_B$ is provided to a pulse generator Josephson junction $JJ_{PG}$ via an inductor $L_{PG}$, such as to provide an approximate $\pi$ radians bias to the pulse generator Josephson junction $JJ_{PG}$. In addition, a first phase of the bias clock signal $CLK_1$ is provided to the pulse generator 210 via a clock inductor $L_{CI}$. As described herein, the bias clock signal CLK can refer to the same sinusoidal clock signal (e.g., an RQL clock signal including in-phase and quadrature-phase components), such that the different bias clock signals CLK provided to the superconducting PTL receiver system 200 can refer to different phases of the bias clock signal CLK, as designated by numerical subscripts. Thus, in response to the $\pi$ radians bias on the pulse generator $JJ_{PG}$ from the induced bias current $I_B$, the pulse generator Josephson junction $JJ_{PG}$ can trigger at approximately a positive zero-crossing of the bias clock signal $CLK_1$ to generate the bias pulse BP as having a pulse-width that is approximately half the period of the bias clock signal CLK.

The biasing buffer 212 can be configured to amplify and propagate the bias pulse BP to the receiver core 202, such as based on different subsequent phases of the bias clock signal CLK. In the example of FIG. 2, the biasing buffer 212 includes two buffer JTL segments. The first buffer JTL segment includes a first inductor $L_{B1}$, a first Josephson junction $JJ_{B1}$, a node 216, and a clock inductor $L_{BC1}$ that provides a second phase of the bias clock signal $CLK_2$. The second buffer JTL segment includes a second inductor $L_{B2}$, a second Josephson junction $JJ_{B2}$, a node 218, and a clock inductor $L_{BC2}$ that provides a third phase of the bias clock signal $CLK_3$. As an example, the second and third phases of the bias clock signal $CLK_2$ and $CLK_3$ can each be subsequent to the first phase of the bias clock signal $CLK_1$, and can be approximately equal to or slightly different with respect to each other (e.g., with the third phase $CLK_3$ being subsequent to the second phase $CLK_2$). The second and third phases of the bias clock signal $CLK_2$ and $CLK_3$ can thus bias the Josephson junctions $JJ_{B1}$ and $JJ_{B2}$, such that the Josephson junctions $JJ_{B1}$ and $JJ_{B2}$ can trigger in response to the bias pulse generated by the pulse generator 210 to amplify and propagate the bias pulse BP through the biasing buffer 212, and as an output from the node 218 to the receiver core 202 via the bias inductor $L_B$.

As an example, the Josephson junctions of the buffer JTLs can be configured differently with respect to the critical currents relative to each other and/or relative to the critical current of the Josephson junctions of the receiver core 202. For example, the Josephson junction of the last buffer JTL in the sequence of buffer JTLs can have a critical current that is greater than the total critical current of the Josephson junctions of the receiver core 202. Thus, the Josephson junction $JJ_{B2}$ can have a critical current greater than a sum of critical currents of the the input Josephson junction $JJ_{IN}$ and the intermediate Josephson junction $JJ_{INT}$. As a result, the triggering of the input Josephson junction $JJ_{IN}$ and the intermediate Josephson junction $JJ_{INT}$ will not result in propagation of the intermediate pulse IP into the biasing buffer 212 through the biasing inductor $L_B$.

The input pulse IN can be provided as having a very small amplitude, such that the receiver core 202 can be configured to have a very small operating range with respect to the biasing of the input Josephson junction $JJ_{IN}$ to provide for sufficient sensitivity to trigger the input Josephson junction $JJ_{IN}$ in response to the input pulse IN. To accommodate the small operating range of the receiver core 202, the active bias circuit 204 can be configured to provide the bias pulse BP as having a smaller peak amplitude variation than the bias clock signal CLK.

To regulate the amplitude of the bias clock signal CLK, the active bias circuit 204 operates as a phase potential divider. As described above, the pulse generator Josephson junction $JJ_{PG}$ can trigger at approximately a positive zero-crossing of the bias clock signal $CLK_1$ to generate the bias pulse BP as having a pulse-width that is approximately half the period of the bias clock signal CLK. The triggering of the pulse generator Josephson junction $JJ_{PG}$ can provide a superconducting phase of $2\pi$ that propagates through the biasing buffer 212, and thus providing a $2\pi$ phase across the Josephson junctions $JJ_{B1}$ and $JJ_{B2}$. The $2\pi$ phase across the Josephson junctions $JJ_{B1}$ and $JJ_{B2}$ is thus provided as a constant, while the clock signal CLK (e.g., the second and third phases $CLK_2$ and $CLK_3$) varies. The constant $2\pi$ phase of the Josephson junctions $JJ_{B1}$ and $JJ_{B2}$ can thus force the phases at the nodes 216 and 218 to approximately $2\pi$ phase despite variations of the second and third phases $CLK_2$ and $CLK_3$, respectively. The node 218 thus operates as a phase-potential divider between the $2\pi$ phase across the Josephson junctions $JJ_{B1}$ and $JJ_{B2}$ and the second and third phases $CLK_2$ and $CLK_3$, respectively, to reduce the phase-potential variation of the bias pulse BP relative to that of the bias clock signal CLK.

Figure 3:
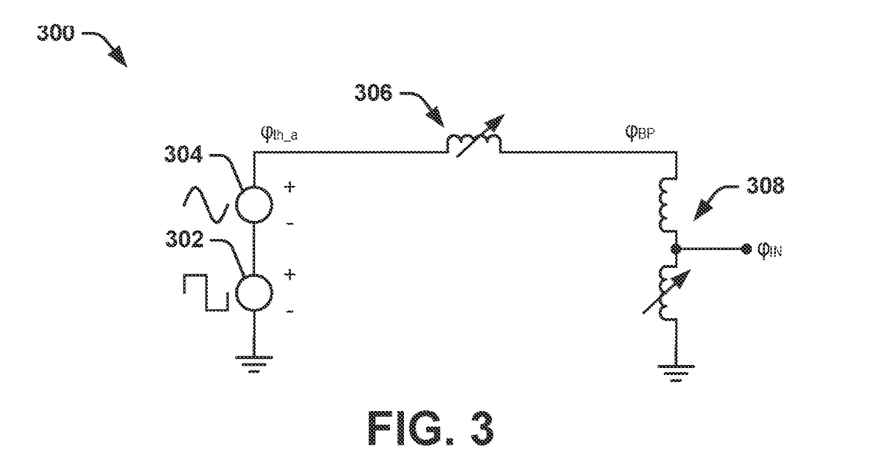
FIG. 3 illustrates an example of a Thevenin-equivalent of a superconducting PTL receiver system.

FIG. 3 illustrates an example diagram 300 of a Thevenin-equivalent of the superconducting PTL receiver system 200. The Thevenin-equivalent diagram 300 demonstrates a phase-potential source of the superconducting PTL receiver system 200. The Thevenin-equivalent diagram 300 includes a square-wave signal generator 302 and a sinusoid signal generator 304 that combine to generate an active bias $\varphi_{th\_a}$ that is a sum of a square wave and a sinusoidal wave. The active bias $\varphi_{th\_a}$ can be provided through an equivalent inductance 306 corresponding to the active biasing provided by the biasing buffer to generate the phase $\varphi_{BP}$ of the bias pulse BP. As described above, the equivalent inductance 306 can correspond to the phase-potential division provided by the $2\pi$ phase across the Josephson junctions $JJ_{B1}$ and $JJ_{B2}$ and the second and third phases $CLK_2$ and $CLK_3$, respectively, thereby providing the phase $\varphi_{BP}$ of the bias pulse $\varphi_{BP}$ as having a lower phase-potential relative to the bias clock signal BP. The phase of the bias pulse $\varphi_{BP}$ is thus demonstrated as being provided through an inductance-divider 308 to provide biasing for the input Josephson junction $JJ_{IN}$, demonstrated as $\varphi_{IN}$. The inductance-divider 308 can thus correspond to the phase-potential divider formed by the biasing inductor $L_B$ and the input Josephson junction $JJ_{IN}$.

As an example, in a pulse high state, the active bias $\varphi_{th\_a}$ can move between approximately 6.97 rad and approximately 6.00 radians. As an example, the optimal bias for the input Josephson junction $JJ_{IN}$ to receive a positive SFQ pulse is approximately 1 radian, whereas the threshold bias for the input Josephson junction $JJ_{IN}$ to receive a positive SFQ pulse can be approximately 600 milliradians. While driving the receiver core 202 in the data low state, the combination can therefore form a phase-potential divider which has a divide ratio of approximately 1/6.6 from the active bias $\varphi_{th\_a}$ to the input Josephson junction $JJ_{IN}$. The result is the generation of the bias pulse BP as a broad bias plateau provided to the input Josephson junction $JJ_{IN}$, which can thus remain high across approximately the positive half-cycle of the bias clock signal CLK.

The phase-potential across the top of the plateau of the bias pulse at the input Josephson junction $JJ_{IN}$ can vary between about 1.05 radians and about 0.9 radians, thus keeping the input Josephson junction $JJ_{IN}$ near the optimal 1.0 radians for reception of the input pulse IN. Based on the symmetry of the active bias circuit 204 about $\pi$ radians, the opposing state in which the receiver core 202 is in the high data state and the active bias circuit 204 is pulsing low results in the bias of the input Josephson junction $JJ_{IN}$ taking the form of an inverted plateau, and thus dropping from approximately $2\pi$ radians. The inverted plateau can thus vary from about 5.28 radians to approximately 5.38 radians, through the negative clock half-cycle of the bias clock signal CLK.

Referring back to the example of FIG. 2, in response to the bias pulse BP being provided to the receiver core 202, the bias pulse BP provides a long duty-cycle bias to the SQUID 208, and thus the input Josephson junction $JJ_{IN}$ and the intermediate Josephson junction $JJ_{INT}$. Thus, the input pulse IN and the bias pulse BP can be sufficient to trigger the input Josephson junction $JJ_{IN}$. The triggering of the input Josephson junction $JJ_{IN}$ likewise triggers the intermediate Josephson junction $JJ_{INT}$ to generate an intermediate pulse IP. The intermediate pulse IP is thus provided to the alignment JTL 206.

In the example of FIG. 2, the alignment JTL 206 includes a first inductor $L_{A1}$, a second inductor $L_{A2}$, a third inductor $L_{A3}$, a first alignment Josephson junction $JJ_{A1}$, a second alignment Josephson junction $JJ_{A2}$, and a clock inductor $L_{C4}$ that is configured to provide a fourth phase of the bias clock signal $CLK_4$. In the example of FIG. 2, the second and third inductors $L_{A2}$ and $L_{A3}$ and the alignment Josephson junctions $JJ_{A1}$ and $JJ_{A2}$ form a SQUID. The fourth phase of the bias clock signal $CLK_4$ can be subsequent to the first phase of the clock signal $CLK_1$ (e.g., by less than or equal to approximately) 90°, and can be concurrent with or subsequent to the second and third phases of the clock signal $CLK_2$ and $CLK_3$. Therefore, the fourth phase of the bias clock signal $CLK_4$ can bias the alignment Josephson junctions $JJ_{A1}$ and $JJ_{A2}$ sufficiently such that the alignment Josephson junctions $JJ_{A1}$ and $JJ_{A2}$ trigger in response to the intermediate pulse IP provided via the inductor $L_{A1}$ to generate the output pulse OUT. The output pulse OUT can thus be aligned to the fourth phase of the bias clock signal $CLK_4$, such that the output pulse OUT can be provided to other parts of the associated superconducting circuit in a manner that is time-aligned with specific phases of the bias clock signal CLK.

Figure 4:
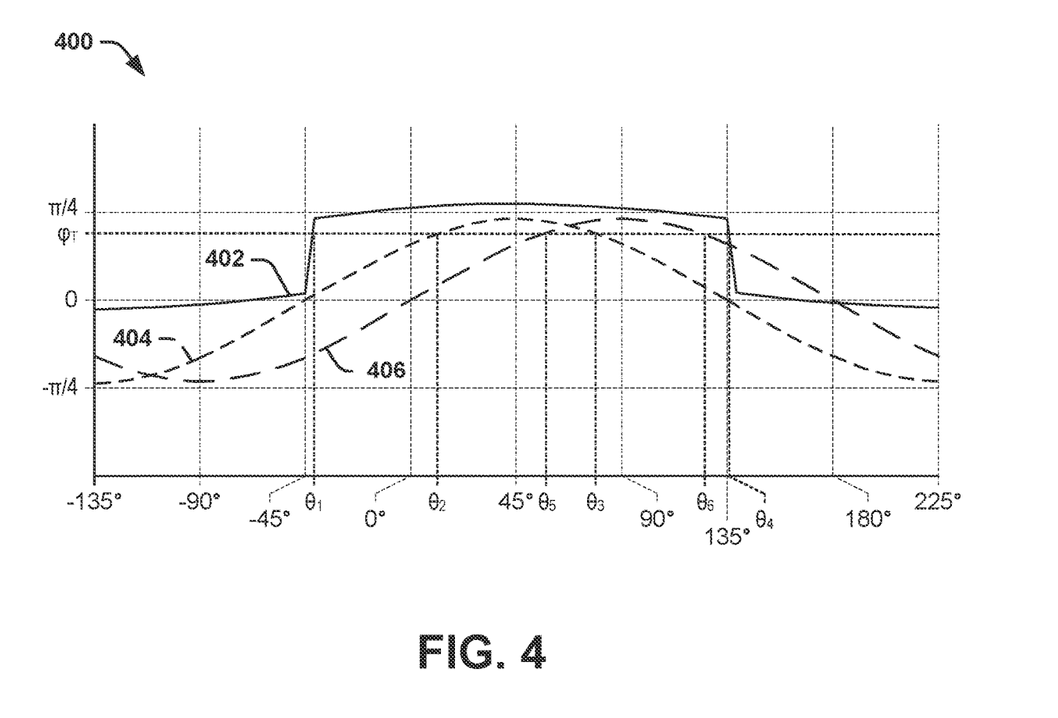
FIG. 4 illustrates an example of a phase diagram.

FIG. 4 illustrates an example of a phase diagram 400. The phase diagram 400 can correspond to the generation of the bias pulse BP and the associated phase relationship in generating the output pulse OUT. Therefore, reference is to be made to the example of FIGS. 1 and 2 in the following description of the example of FIG. 4.

The phase diagram 400 includes the bias pulse BP at 402 (demonstrated as a solid line), the first phase of the bias clock signal $CLK_1$ at 404 (demonstrated as a short-dashed line), and the fourth phase of the bias clock signal $CLK_4$ at 406 (demonstrated as a long-dashed line). The fourth phase of the bias clock signal 406 is demonstrated as approximately 45° phase-delayed with respect to the first phase of the bias clock signal 404.

The phase diagram 400 demonstrates the relationship between the first phase of the clock signal 404 and the bias pulse 402. As described previously, the induced bias current $I_B$ provides an approximate $\pi$ radians bias on the pulse generator $JJ_{PG}$. Therefore, the pulse generator Josephson junction $JJ_{PG}$ can trigger at approximately a positive zero-crossing of the bias clock signal $CLK_1$ to generate the bias pulse BP. In the example of FIG. 4, as the first phase of the bias clock signal 404 crosses zero at −45°, the pulse generator Josephson junction $JJ_{PG}$ can trigger to generate the bias pulse 402. The bias pulse 402 can thus provide sufficient bias for the input Josephson junction $JJ_{IN}$ significantly sooner than the first phase of the clock signal 404. In the example of FIG. 4, the bias pulse 402 achieves sufficient bias to trigger the input Josephson junction $JJ_{IN}$, demonstrated as $\varphi_T$ (e.g., approximately 600 milliradians), at a phase angle $\theta_1$, shortly after being asserted.

By contrast, the first phase of the bias clock signal 404 does not achieve the sufficient bias $\varphi_T$ until a phase angle $\theta_2$, slightly more than 45° subsequent to the phase angle $\theta_1$. Additionally, the first phase of the bias clock signal 404 only achieves the sufficient bias Or for a relatively short time, decreasing to less than the sufficient bias $\varphi_T$ at a phase angle $\theta_3$. Thus, the window for the first phase of the clock signal 404 to provide the sufficient bias Or is between the phase angles $\theta_2$ and $\theta_3$, which is demonstrated in the example of FIG. 4 as less than 90°. However, the bias pulse 402 continues to provide the sufficient bias Or until the first phase of the clock signal 404 no longer provides bias to the pulse generator Josephson junction $JJ_{PG}$, at a phase angle $\theta_4$ slightly after 135°. Therefore, the bias pulse 402 provides the sufficient bias $\varphi_T$ for approximately 180° of the period of the bias clock signal CLK. Accordingly, the bias pulse 402 provides a significantly greater open propagation window for capturing the input pulse IN than by implementing a phase of the bias clock signal CLK.

As described previously, because the bias pulse BP is generated with such a large duty-cycle of the period of the bias clock signal CLK, and based on the phase-delay of the fourth phase of the bias clock signal 406 provided to the alignment JTL 110 relative to the first phase of the bias clock signal 404, and thus relative to the phase of the bias pulse 402, the superconducting PTL receiver system 200 can implement pulse waiting with respect to the input pulse IN. As described above, the fourth phase of the bias clock signal 406 is demonstrated as approximately 45° phase-delayed with respect to the first phase of the bias clock signal 404. As also described above, the bias pulse 402 achieves the sufficient bias Or at the phase angle $\theta_1$. Thus, the input pulse IN can be captured by the receiver core 202 to trigger the input Josephson junction $JJ_{IN}$ at any time from $\theta_1$ to $\theta_4$. The SQUID 208 can thus generate the intermediate pulse IP throughout the pulse-width of the bias pulse 402.

As demonstrated in the example of FIG. 4, the fourth phase of the bias clock signal 406 achieves the sufficient bias $\varphi_T$ at a phase angle $\theta_5$. Therefore, the phase window between the angles $\theta_1$ and $\theta_5$ can thus define a pulse waiting window during which the input pulse IN can arrive from the PTL to the receiver core 202 prior to fourth phase of the bias clock signal 406 achieving the sufficient bias $\varphi_T$. The fourth phase of the bias clock signal 406 has the sufficient bias $\varphi_T$ from the phase angle $\theta_5$ until the phase angle $\theta_6$, at which time the fourth phase of the bias clock signal 406 decreases less than the sufficient bias $\varphi_T$. Therefore, the phase angles $\theta_5$ and $\theta_6$ define a JTL open propagation window of the alignment JTL 206, such that the alignment Josephson junctions $JJ_{A1}$ and $JJ_{A2}$ can trigger in response to the intermediate pulse IP and the fourth phase of the bias clock signal 406 to provide the output pulse OUT. Thus, the superconducting PTL receiver system 200 has a total active receiver range that is defined by the window between the phase angle $\theta_1$ and the phase angle $\theta_6$, which corresponds to slightly less than 180°. Accordingly, the superconducting PTL receiver system 200 can implement pulse-waiting to provide for a significantly greater open propagation window than a typical superconducting PTL receiver system.

Figure 5:
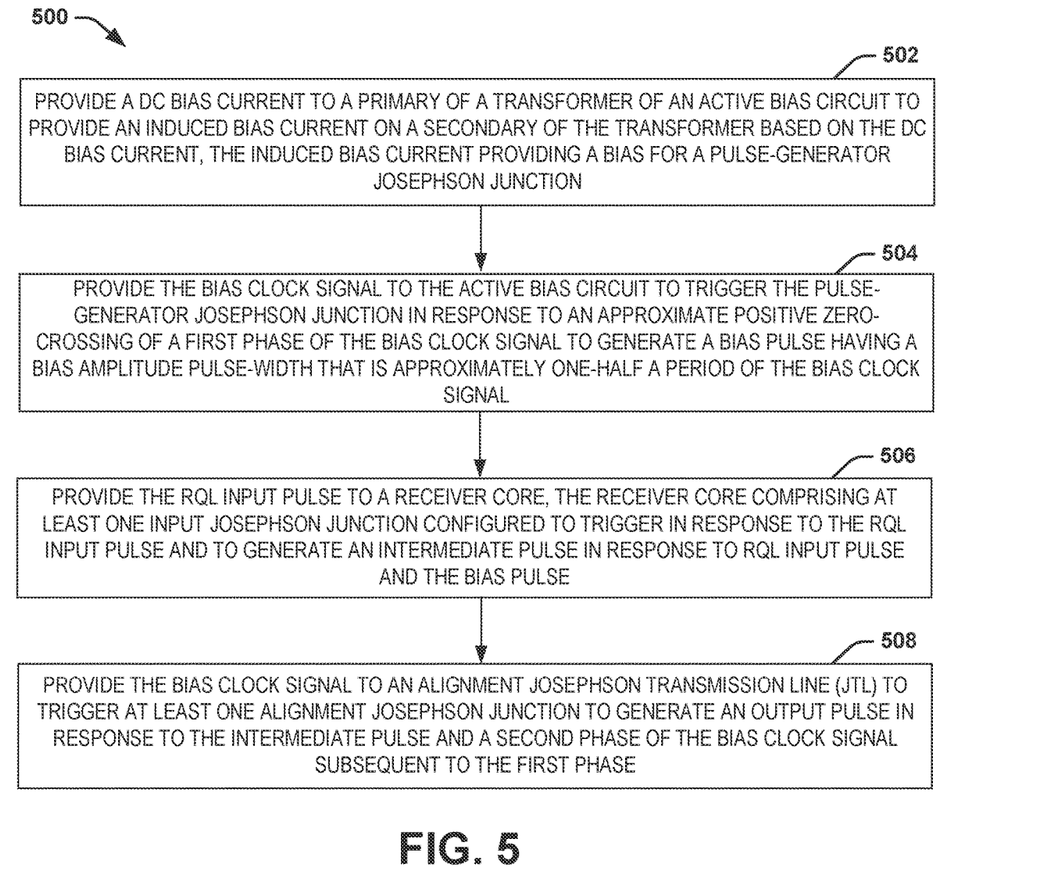
FIG. 5 illustrates an example of a method for aligning an RQL input pulse from a PTL to a phase of a bias clock signal.

In view of the foregoing structural and functional features described above, a methodology in accordance with various aspects of the disclosure will be better appreciated with reference to FIG. 5. It is to be understood and appreciated that the method of FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 5 illustrates an example of a method 500 for aligning a reciprocal quantum logic (RQL) input pulse (e.g., the input pulse IN) from a passive transmission line (PTL) to a phase of a bias clock signal (e.g., the fourth phase of the bias clock signal $CLK_4$). At 502, a DC bias current (e.g., the DC bias current $I_{DC}$) is provided to a primary (e.g., the primary $L_{PRI}$) of a transformer (e.g., the transformer 214) of an active bias circuit (e.g., the active bias circuit 104) to provide an induced bias current (e.g., the induced bias current $I_B$) on a secondary (e.g., the secondary $L_{SEC}$) of the transformer based on the DC bias current. The induced bias current can provide a bias for a pulse-generator Josephson junction (e.g., the pulse generator Josephson junction $JJ_{PG}$). At 504, the bias clock signal is provided to the active bias circuit to trigger the pulse-generator Josephson junction in response to an approximate positive zero-crossing of a first phase of the bias clock signal (e.g., the first phase of the clock signal $CLK_1$) to generate a bias pulse (e.g., the bias pulse BP) having a bias amplitude pulse-width that is approximately one-half a period of the bias clock signal. At 506, the RQL input pulse is provided to a receiver core (e.g., the receiver core 102). The receiver core includes at least one input Josephson junction (e.g., the input Josephson junction $JJ_{IN}$) configured to trigger in response to the RQL input pulse and the to generate an intermediate pulse (e.g., the intermediate pulse IP) in response to the input pulse and the bias pulse. At 508, the bias clock signal is provided to an alignment JTL (e.g., the alignment JTL 110) to trigger at least one alignment Josephson junction (e.g., the alignment Josephson junctions $JJ_{A1}$ and $JJ_{A2}$) to generate an output pulse (e.g., the output pulse OUT) in response to the intermediate pulse and a second phase of the bias clock signal (e.g., the fourth phase of the bias clock signal $CLK_4$) subsequent to the first phase.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a." "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A passive transmission line (PTL) receiver system comprising:
   a receiver core comprising at least one input Josephson junction and configured to receive an input pulse from a PTL;
   an active bias circuit configured to generate a bias pulse based on a bias clock signal and to provide the bias pulse to the receiver core, the bias pulse having a bias amplitude pulse-width that is approximately one-half a period of the bias clock signal, the at least one input Josephson junction of the receiver core being configured to trigger to generate an intermediate pulse in response to the input pulse and the bias pulse; and
   an alignment Josephson transmission line (JTL) comprising at least one alignment Josephson junction, the at least one alignment Josephson junction of the alignment JTL being configured to trigger to generate an output pulse in response to the intermediate pulse and the bias clock signal to provide for reception of the input pulse across a wide timing window based on the bias pulse.

2. The system of claim 1, wherein the active bias circuit comprises:
a pulse generator configured to generate the bias pulse based on the bias clock signal; and
a biasing buffer configured to amplify the bias pulse and to propagate the bias pulse to the receiver core.

3. The system of claim 2, wherein the pulse generator comprises:
a transformer comprising a primary configured to conduct a DC bias current and a secondary configured to provide an induced bias current based on the DC bias current; and
a JTL coupled to the secondary and comprising a pulse generator Josephson junction, the pulse generator Josephson junction being biased by the induced bias current to trigger in response to an approximate positive zero-crossing of the bias clock signal.

4. The system of claim 2, wherein the pulse generator is configured to generate the bias pulse based on a first phase of the bias clock signal, wherein the biasing buffer comprises at least one buffer JTL each comprising a buffer Josephson junction, wherein the buffer Josephson junction of each of the at least one buffer JTL triggers sequentially in response to respective phases of the bias clock signal subsequent to the first phase to propagate the bias pulse to the receiver core.

5. The system of claim 4, wherein the buffer Josephson junction of a last one of the at least one buffer JTL has a critical current that is selected to be greater than a critical current associated with the at least one input Josephson junction to mitigate propagation of the intermediate pulse to the biasing buffer.

6. The system of claim 1, wherein the active bias circuit is configured to generate the bias pulse based on a first phase of the bias clock signal, wherein the alignment JTL is configured to trigger the at least one alignment Josephson junction to generate the output pulse in response to the intermediate pulse and a second phase of the bias clock signal subsequent to the first phase of the bias clock signal.

7. The system of claim 6, wherein the second phase of the bias clock signal is less than or equal to approximately 90° subsequent to the first phase of the bias clock signal to provide pulse waiting for the input pulse based on a combination of the receiver core and the alignment JTL.

8. The system of claim 1, wherein the at least one input Josephson junction of the receiver core is selected to have a smaller biasing margin than the at least one alignment Josephson junction of the alignment JTL, wherein the active bias circuit is configured to regulate a peak amplitude of the bias pulse to be smaller than a peak amplitude of the bias clock signal.

9. The system of claim 1, wherein the active bias circuit is arranged as a phase-potential divider to provide sufficient bias of the at least one input Josephson junction to trigger the at least one input Josephson junction in response to the input pulse across the bias amplitude pulse-width of approximately one-half the period of the bias clock signal.

10. The system of claim 1, wherein the receiver core comprises an input resistor through which the input pulse is provided as a reciprocal quantum logic (RQL) pulse.

11. A method for aligning a reciprocal quantum logic (RQL) input pulse from a passive transmission line (PTL) to a phase of a bias clock signal, the method comprising:
providing a DC bias current to a primary of a transformer of an active bias circuit to provide an induced bias current on a secondary of the transformer based on the DC bias current, the induced bias current providing a bias for a pulse-generator Josephson junction;
providing the bias clock signal to the active bias circuit to trigger the pulse-generator Josephson junction in response to an approximate positive zero-crossing of a first phase of the bias clock signal to generate a bias pulse having a bias amplitude pulse-width that is approximately one-half a period of the bias clock signal;
providing the RQL input pulse to a receiver core, the receiver core comprising at least one input Josephson junction configured to trigger in response to the RQL input pulse and to generate an intermediate pulse in response to RQL input pulse and the bias pulse; and
providing the bias clock signal to an alignment Josephson transmission line (JTL) to trigger at least one alignment Josephson junction to generate an output pulse in response to the intermediate pulse and a second phase of the bias clock signal subsequent to the first phase to provide for reception of the input pulse across a wide timing window based on the bias pulse.

12. The method of claim 11, further comprising providing the bias clock signal to at least one third phase to a biasing buffer to amplifying the bias pulse and propagate the bias pulse to the receiver core, the at least one third phase of the bias clock signal being subsequent to the first phase and previous to or concurrent with the second phase.

13. The method of claim 11, wherein the second phase of the bias clock signal is less than or equal to approximately 90° subsequent to the first phase of the bias clock signal to provide pulse waiting for the RQL input pulse based on a combination of the receiver core and the alignment JTL.

14. The method of claim 11, wherein providing the bias clock signal to the active bias circuit comprises providing the bias clock signal to the active bias circuit to trigger the pulse-generator Josephson junction in response to an approximate positive zero-crossing of the first phase of the bias clock signal to generate the bias pulse as a broad plateau pulse that is a combination of a sinusoidal wave and a square wave.

15. The method of claim 11, wherein providing the bias clock signal to the active bias circuit comprises providing the bias clock signal to the active bias circuit to trigger the pulse-generator Josephson junction in response to an approximate positive zero-crossing of the first phase of the bias clock signal to generate the bias pulse as having sufficient bias of the at least one input Josephson junction to trigger the at least one input Josephson junction in response to the RQL input pulse across the bias amplitude pulse-width of approximately one-half the period of the bias clock signal.

16. A reciprocal quantum logic (RQL) passive transmission line (PTL) receiver system comprising:
a receiver core comprising an input resistor and at least one input Josephson junction and configured to receive a reciprocal quantum logic (RQL) input pulse from a PTL through the input resistor;
an active bias circuit comprising:
a pulse generator configured to generate a bias pulse based on a first phase of a bias clock signal, the bias pulse having a bias amplitude pulse-width that is approximately one-half a period of the bias clock signal; and
a biasing buffer configured to amplify the bias pulse and to propagate the bias pulse to the receiver core, the at least one input Josephson junction of the receiver core being configured to trigger to generate an intermediate pulse in response to the RQL input pulse and the bias pulse; and an alignment Josephson transmission line (JTL) comprising at least one alignment Josephson junction, the at least one alignment Josephson junction of the alignment JTL being configured to trigger to generate an output pulse in response to the intermediate pulse and a second phase of the bias clock signal that is subsequent to the first phase to provide for reception of the input pulse across a wide timing window based on the bias pulse.

17. The system of claim 16, wherein the pulse generator comprises:
   a transformer comprising a primary configured to conduct a DC bias current and a secondary configured to provide an induced bias current based on the DC bias current; and
   a JTL coupled to the secondary and comprising a pulse generator Josephson junction, the pulse generator Josephson junction being biased by the induced bias current to trigger in response to an approximate positive zero-crossing of the bias clock signal.

18. The system of claim 16, wherein the pulse generator is configured to generate the bias pulse based on the first phase of the bias clock signal, wherein the biasing buffer comprises at least one buffer JTL each comprising a buffer Josephson junction, wherein the buffer Josephson junction of each of the at least one buffer JTL triggers sequentially in response to respective phases of the bias clock signal subsequent to the first phase to propagate the bias pulse to the receiver core.

19. The system of claim 18, wherein the buffer Josephson junction of a last one of the at least one buffer JTL has a critical current that is selected to be greater than a critical current associated with the at least one input Josephson junction to mitigate propagation of the intermediate pulse to the biasing buffer.

20. The system of claim 16, wherein the at least one input Josephson junction of the receiver core is selected to have a smaller biasing margin than the at least one alignment Josephson junction of the alignment JTL, wherein the active bias circuit is configured to regulate a peak amplitude of the bias pulse to be smaller than a peak amplitude of the bias clock signal.

* * * * *